(12) United States Patent
Srinivasan et al.

(10) Patent No.: US 11,680,982 B2
(45) Date of Patent: Jun. 20, 2023

(54) AUTOMATIC TEST PATTERN GENERATION CIRCUITRY IN MULTI POWER DOMAIN SYSTEM ON A CHIP

(71) Applicant: STMicroelectronics International N.V., Geneva (CH)

(72) Inventors: Venkata Narayanan Srinivasan, Greater Noida (IN); Manish Sharma, Haryana (IN); Tripti Gupta, Noida (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/510,602

(22) Filed: Oct. 26, 2021

(65) Prior Publication Data

US 2023/0128466 A1 Apr. 27, 2023

(51) Int. Cl.
| | | |
|---|---|---|
| *G01R 31/3177* | (2006.01) | |
| *G01R 31/317* | (2006.01) | |
| *G06F 1/28* | (2006.01) | |
| *G01R 31/3185* | (2006.01) | |
| *G06F 1/18* | (2006.01) | |

(52) U.S. Cl.
CPC ... *G01R 31/3177* (2013.01); *G01R 31/31721* (2013.01); *G06F 1/28* (2013.01); *G01R 31/31723* (2013.01); *G01R 31/318513* (2013.01); *G01R 31/318536* (2013.01); *G01R 31/318555* (2013.01); *G01R 31/318558* (2013.01); *G01R 31/318575* (2013.01); *G06F 1/18* (2013.01)

(58) Field of Classification Search
CPC .... G01R 31/318536; G01R 31/318555; G01R 31/31723; G01R 31/318558; G01R 31/318513; G01R 31/3177; G01R 31/318575; G01R 31/31721; G06F 1/18; G06F 1/28
See application file for complete search history.

(56) References Cited

U.S. PATENT DOCUMENTS

| | | |
|---|---|---|
| 3,001,433 A1 | 8/2011 | Bhatia et al. |
| 2008/0071513 A1* | 3/2008 | Chickermane ... G01R 31/31721 703/15 |
| 2008/0276140 A1 | 11/2008 | Gemmeke et al. |
| 2009/0326854 A1 | 12/2009 | Chakravadhanula et al. |
| 2013/0103994 A1* | 4/2013 | Tekumalla ..... G01R 31/318558 714/E11.155 |
| 2013/0159800 A1 | 6/2013 | Ravi et al. |
| 2014/0298123 A1 | 10/2014 | Tekumalla |

OTHER PUBLICATIONS

First Office Action for counterpart EP Appl. No. 22201456.5, report dated Mar. 17, 2023, 13 pgs.

* cited by examiner

*Primary Examiner* — Cynthia Britt
*Assistant Examiner* — Sazzad Hossain
(74) *Attorney, Agent, or Firm* — Crowe & Dunlevy

(57) ABSTRACT

Described herein are integrated circuit chips having test circuitry designed such that independently selectable testing of different power domains using a same scan chain compressor-decompressor circuit may be performed. Also disclosed herein are integrated circuit chips having test circuitry designed such that independently selectable testing of different power domains using multiple different scan chain compressor-decompressor circuits may be performed.

17 Claims, 4 Drawing Sheets

AUTOMATIC TEST PATTERN GENERATION CIRCUITRY IN MULTI POWER DOMAIN SYSTEM ON A CHIP

TECHNICAL FIELD

This disclosure is related to the field of test circuits integrated within devices that enable quicker testing of those devices.

BACKGROUND

After integrated circuits are produced, it is desirable to be able to test those integrated circuits for proper function so that malfunctioning integrated circuits can be removed and production yield can be determined. This is typically performed using a test apparatus that connects to pins or pads of the integrated circuit, provides power to the integrated circuit, and causes entry of the integrated circuit into a desired one of its test modes.

It is desired for this device testing to be performed as quickly and as simply as possible, so as to reduce costs and manufacturing efficiency. However, a challenge arises in that different components or regions of an integrated circuit may be within different power domains. These different power domains may be powered by multiple different voltage stacks, with the voltage stack changing according to which of the power domains are to be powered.

As a non-limiting example, suppose that an integrated circuit has an independent power domain (referred to as "ED") that is independently powered and independently activatable, and has three other power domains (referred to as "PD2", "PD1", and "PD0"). When the integrated circuit is to be tested in an emulation mode in which the independently activatable power domain ED is the sole power domain activated, the voltage stack applied has a minimum voltage of 0.88 v; when the integrated circuit is to be tested in an application mode in which power domains PD2, PD1, and PD0 are activated, the voltage stack applied has a minimum voltage of 0.88 v; when the integrated circuit is to be tested in a low power mode in which the power domains PD1 and PD0 are activated, the voltage stack applied has a minimum voltage of 0.8 v; and when the integrated circuit is to be tested in a standby mode in which the power domain PD0 is activated, the voltage stack applied has a minimum voltage of 0.8 v.

As non-limiting example of test progression, testing given this challenge may currently proceed by first supplying the voltage stack with the 0.88 v minimum voltage and running the required testing (for example, in application mode) at 0.88 v at full speed, testing all power domains at this speed. Next, the voltage stack with the 0.8 v minimum voltage will be supplied, and the required testing (for example, in low power mode) will be run at a lower frequency, testing all power domains at this voltage and frequency, even though not all power domains require testing at this voltage and frequency. This results in an increase in test time due to the lower frequency used so as to ensure proper functionality of the power domains that do not actually require testing with the lower minimum voltage. This also limits the testing of power domains which need not be supplied in all packages to tests using only functional patterns instead of automated test pattern generation (ATPG) testing.

As such, existing techniques for powering the different power domains during testing are inadequate, as they take an excess amount of time to perform and to not permit ATPG testing of all power domains. Therefore, further development into this area is required.

SUMMARY

Disclosed herein is an integrated circuit chip, including: a single scan chain compressor-decompressor pair having a scan chain compressor and a scan chain decompressor, the scan chain compressor providing output to at least one scan out pin, the scan chain decompressor receiving input from at least one automatic test pattern generation (ATPG) pin; and a test grouping.

The test grouping includes: a first multiplexer located within first and second power domains; a plurality of first components located within the first and second power domains, the plurality of first components being selectively formed into a first scan chain portion coupled between the scan chain decompressor and a first input of the first multiplexer; a first bypass circuit located within the first and second power domains, the first bypass circuit being coupled between the scan chain decompressor and a second input of the first multiplexer; a second multiplexer located within a third power domain; a plurality of second components located within the third power domain, the plurality of second components being selectively formed into a second scan chain portion coupled between an output of the first multiplexer and a first input of the second multiplexer; a second bypass circuit located within the third power domain, the second bypass circuit being coupled between the output of the first multiplexer and a second input of the second multiplexer; a third multiplexer; a plurality of third components located without a fourth power domain, the plurality of third components being selectively formed into a scan chain portion coupled between an output of the second multiplexer and a first input of the third multiplexer; and a third bypass circuit coupled between the output of the second multiplexer and a second input of the third multiplexer, an output of the third multiplexer being coupled to the scan chain compressor.

A control circuit is configured to control the first, second, and third multiplexers such that a scan chain can selectively be placed into a configuration: a) extending from the scan chain decompressor, through the plurality of first components into the first multiplexer, from the first multiplexer through the second bypass circuit into the second multiplexer, from the second multiplexer through the third bypass circuit into the third multiplexer, and from the third multiplexer into the scan chain compressor; b) extending from the scan chain decompressor, through the first bypass circuit into the first multiplexer, from the first multiplexer through the plurality of second components into the second multiplexer, from the second multiplexer through the third bypass circuit into the third multiplexer, and from the third multiplexer into the scan chain compressor; and c) extending from the scan chain decompressor, through the first bypass circuit into the first multiplexer, from the first multiplexer through the second bypass circuit into the second multiplexer, from the second multiplexer through the plurality of third components into the third multiplexer, and from the third multiplexer into the scan chain compressor.

The third bypass circuit and third multiplexer may be located within the third power domain.

The fourth power domain may be an independent power domain that is supplied independently of the first, second, and third power domains.

A minimum voltage supplied to the first and second power domains may be a first voltage, and a minimum voltage supplied to the third and fourth power domains may be a second voltage greater than the first voltage.

The control circuit may be configured to control the first, second, and third multiplexers to place the scan chain into configuration a) to thereby test the first and second power domains at the first voltage, while bypassing testing of the third and fourth power domains.

The control circuit may be configured to control the first, second, and third multiplexers to place the scan chain into configuration b) to thereby test the third power domain at the second voltage, while bypassing testing of the first, second, and fourth power domains.

The control circuit may be configured to control the first, second, and third multiplexers to place the scan chain into configuration c) to thereby test the fourth power domain at the second voltage, while bypassing testing of the first, second, and third power domains.

Also disclosed herein is an integrated circuit chip, including: a single scan chain compressor-decompressor pair having a scan chain compressor and a scan chain decompressor, the scan chain compressor providing output to at least one scan out pin, the scan chain decompressor receiving input from at least one automatic test pattern generation (ATPG) pin; and a first test grouping.

The first test grouping includes: a first multiplexer located within a first power domain; a plurality of first components located within the first power domain, the plurality of first components being selectively formed into a first scan chain portion coupled between the scan chain decompressor and a first input of the first multiplexer; a first bypass circuit located within the first power domain, the first bypass circuit being coupled between the scan chain decompressor and a second input of the first multiplexer.

A second test grouping includes: a second multiplexer; a plurality of second components located within a second power domain, the plurality of second components being selectively formed into a second scan chain portion coupled between an output of the first multiplexer and a first input of the second multiplexer; and a second bypass circuit located within the second power domain, the second bypass circuit being coupled between the output of the first multiplexer and a second input of the second multiplexer. An output of the second multiplexer is ultimately coupled to the scan chain compressor.

A control circuit is configured to control the first and second multiplexers to selectively form a scan chain in a configuration which: a) extends from the scan chain decompressor, through the plurality of first components into the first multiplexer, from the first multiplexer through the second bypass circuit into the second multiplexer, and ultimately into the scan chain compressor; and b) extends from the scan chain decompressor, through the first bypass circuit into the first multiplexer, from the first multiplexer through the plurality of second components into the second multiplexer, and ultimately into the scan chain compressor.

A minimum voltage may be supplied to the first power domain is a first voltage; and a minimum voltage supplied to the second power domain may be a second voltage greater than the first voltage.

The control circuit may be configured to control the first and second multiplexers to place the scan chain into configuration a) to thereby test the first power domain at the first voltage, while bypassing testing of the second power domain.

The control circuit may be configured to control the first and second multiplexers to place the scan chain into configuration b) to thereby test the second power domain at the second voltage, while bypassing testing of the first power domain.

The second multiplexer may be located within the first power domain.

Also disclosed herein is an integrated circuit chip, including: a single scan chain compressor-decompressor pair with a scan chain compressor and a scan chain decompressor, the scan chain compressor providing output to at least one scan out pin, the scan chain decompressor receiving input from at least one automatic test pattern generation (ATPG) pin; and a first test grouping. The first test grouping includes: a first multiplexer located within a first power domain; a plurality of first components located within the first power domain, the plurality of first components being selectively formed into a scan chain portion coupled between the scan chain decompressor and a first input of the first multiplexer, an output of the first multiplexer being coupled to the scan chain compressor; and a first bypass circuit located within the first power domain, the first bypass circuit being coupled between the scan chain decompressor and a second input of the first multiplexer.

A second test grouping includes: a second multiplexer; a plurality of second components located within a second power domain, the plurality of second components being selectively formed into a scan chain portion coupled between the scan chain decompressor and a first input of the second multiplexer, an output of the second multiplexer being coupled to the scan chain compressor; and a second bypass circuit located within the second power domain, the second bypass circuit being coupled between the scan chain decompressor and a second input of the second multiplexer.

A control circuit is configured to control the first and second multiplexers such that the scan chain can selectively be placed into a configuration: a) extending from the scan chain decompressor, through the plurality of first components into the first multiplexer, and from the first multiplexer into the scan chain compressor; and b) extending from the scan chain decompressor, through the plurality of second components into the second multiplexer, and from the second multiplexer into the scan chain compressor.

A minimum voltage supplied to the first power domain may be a first voltage, and a minimum voltage supplied to the second power domain may be a second voltage greater than the first voltage.

The control circuit may be configured to control the first and second multiplexers to place the scan chain into configuration a) to thereby test the first power domain at the first voltage, while bypassing testing of the second power domain.

The control circuit may be configured to control the first and second multiplexers to place the scan chain into configuration b) to thereby test the second power domain at the second voltage, while bypassing testing of the first power domain.

The second multiplexer may be located within the first power domain.

The second power domain may be an independent power domain that is supplied independently of the first power domain.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein. Do note that in the below description, any described resistor or resistance is a discrete device unless the contrary is stated, and is not simply an electrical lead between two points. Thus, any described resistor or resistance coupled between two points has a greater resistance than a lead between those two points would have, and such resistor or resistance cannot be interpreted to be a lead. Note that herein, the described components and described "areas" are physical circuits.

A. Testing Multiple Power Domains Using Same Compressor-Decompressor (CODEC)

Figure 1:
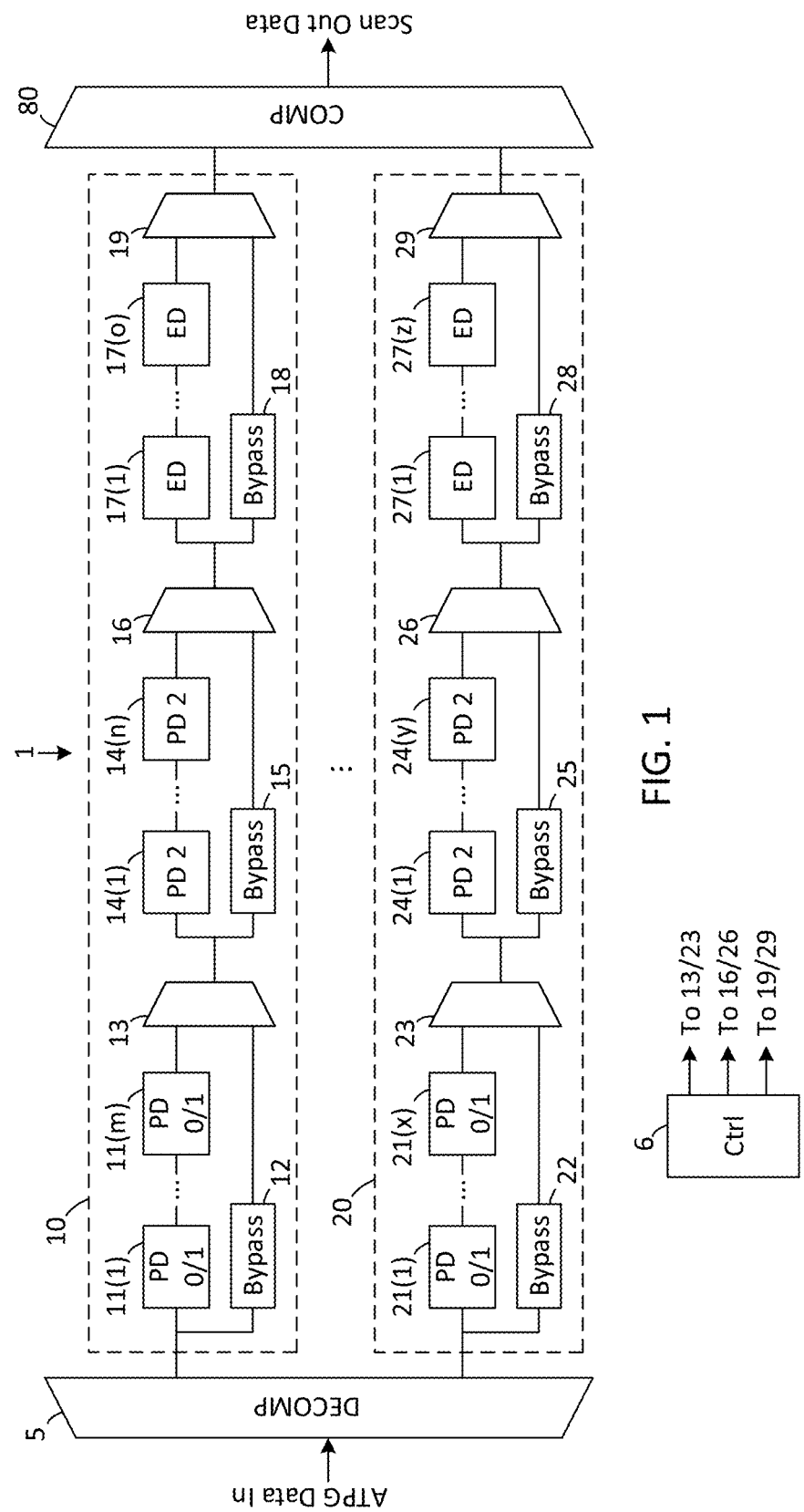
FIG. 1 is a schematic block diagram showing a first embodiment of circuitry enabling the independently selectable testing of different power domains within a single integrated circuit chip using a same scan chain compressor-decompressor circuit, as described herein.

Now described with reference to FIG. 1 is a first embodiment of a test circuit 1 incorporated within an integrated circuit die such as a system-on-a-chip. The test circuit 1 includes a first test group 10 (e.g., a scan chain) receiving the currently utilized voltage stack from a scan decompression circuit 5. Data flow is from the scan decompression circuit 5 to the first test group 10, and through the first test group 10 to a scan compression circuit 80. The scan decompression circuit 5 includes routing from ATPG pins of the integrated circuit to multiple scan chains, and the scan compression circuit 80 including the routing from the multiple scan chains back to the scan out pins of the integrated circuit. The number of scan chains is greater than the number of ATPG pins of the integrated circuit and is greater than the number of scan out pins of the integrated circuit.

The first test group 10 includes: a first series of areas 11(1), . . . , 11(m) coupled in series within a first power domain PD0 and a second power domain PD1 which are coupled in parallel with a PD0/1 bypass circuit 12 between an output of the scan decompression circuit 5 and inputs of a multiplexer 13; a second series of areas 14(1), . . . , 14(n) coupled in series within a third power domain PD2 which are coupled in parallel with a PD2 bypass circuit 15 between the output of the multiplexer 13 and inputs of a multiplexer 16; and a third series of areas 17(1), . . . , 17(o) coupled in series within an independent power domain (e.g., emulation domain) ED which are coupled in parallel with an ED bypass circuit 18 between the output of the multiplexer 16 and inputs of a multiplexer 19. The output of the multiplexer 19 is received by the scan compression circuit 80. Here, m, n, and o each denote an integer, and these integers may be different from one another. There may be any number m of first areas 11, any number n of second areas 14, and any number o of third areas 17. It is to be appreciated that the ED bypass 18 and multiplexer 19 are placed within the PD2 power domain so as to remain functional when the independent power domain ED is not selected.

The test circuit 1 also includes a second test group 20 receiving the currently utilized voltage stack from the scan decompression circuit 5. Data flow is from the scan decompression circuit 5 to the second test group 20, and through the second test group 20 to the scan compression circuit 80.

The second test group 20 (e.g., a scan chain) includes: a first series of areas 21(1), . . . , 21(x) coupled in series within the first power domain PD0 and the second power domain PD1 which are coupled in parallel with a PD0/1 bypass circuit 22 between an output of the scan decompression circuit 5 and inputs of a multiplexer 23; a second series of areas 24(1), . . . , 24(y) coupled in series within the third power domain PD2 which are coupled in parallel with a PD2 bypass circuit 25 between the output of the multiplexer 23 and inputs of a multiplexer 26; and a third series of areas 27(1), . . . , 27(z) coupled in series within the independent power domain ED which are coupled in parallel with an ED bypass circuit 28 between the output of the multiplexer 26 and inputs of a multiplexer 29. The output of the multiplexer 29 is received by the scan compression circuit 80. Here, x, y, and z each denote an integer, and these integers may be different from one another. There may be any number x of first areas 21, any number y of second areas 24, and any number z of third areas 27. It is to be appreciated that the ED bypass 28 and multiplexer 29 are placed within the PD2 power domain so as to remain functional when the independent power domain ED is not selected.

Regarding testing, power domains PD1 and PD0 are to be tested at a first voltage (e.g., 0.8 v), while power domain PD2 is to be tested at a second voltage (e.g., 0.88 v) that is greater than the first voltage. The independent power domain ED is likewise to be tested at 0.88 v.

Utilizing the structure of the first group 10, the power domains PD1 and PD0 can be tested at 0.8 v without the power domain PD2 and the independent power domain ED also being tested at 0.8 v at the same time. To accomplish this, a control circuit 6 suitably operates the multiplexers 13, 16, and 19.

For example, to test the power domains PD1 and PD0 at 0.8 v, without testing the power domain PD2 and the independent power domain ED, the control circuit 6 causes the multiplexers 13/23 to select the output of the areas 11(m)/21(x), causes the multiplexers 16/26 to select the PD2 bypasses 15/25, and causes the multiplexers 19/29 to select the ED bypasses 18/28. Thus, to test the power domains PD1 and PD0, the scan chains run from the scan decompression circuit 5, through the areas 11/21, though the multiplexers 13/23, through the PD2 bypasses 15/25, through the multiplexers 16/26, and through the ED bypasses 18/28, through the multiplexers 19/29, to the scan compression circuit 80.

To test the power domain PD2 at 0.88 v, the control circuit 6 causes the multiplexers 13/23 to select the PD0/1 bypasses 12/22, causes the multiplexers 16/26 to select the output of the areas 14(n)/24(y), and causes the multiplexers 19/29 to select the ED bypasses 18/28. Thus, to test the power domain PD2, the scan chains run from the scan decompression circuit 5, through the PD0/1 bypass circuits 12/22, though the multiplexers 13/23, through the areas 14/24, through the multiplexer 16/26, through the ED bypasses 18/28, through the multiplexers 19/29, to the scan compression circuit 80.

To test the independent power domain ED, the control circuit 6 causes the multiplexers 13/23 to select the PD0/1 bypasses 12/22, causes the multiplexers 16/26 to select the PD2 bypasses 15/25, and causes the multiplexers 19/29 to select the output of the areas 17($o$)/27($z$). Thus, to test the independent power domain ED, the scan chains run from the scan decompression circuit 5, through the PD0/1 bypass circuits 12/22, though the multiplexers 13/23, through the PD2 bypass circuits 15/25, through the multiplexer 16/26, and through the areas 17/27, through the multiplexers 19/29, to the scan compression circuit 80.

Naturally, other test patterns may be formed. For example, the multiplexers 13/23, 16/26, and 19/29 may be controlled by the control circuit 6 such that PD0, PD1, PD2, and ED are all tested in a single pass, or such that PD0/PD1 and ED are tested in a single pass, or such that PD2 and ED are tested in a single pass, or such that PD0/PD1 and PD2 are tested in a single pass. Any such permutations permitted by the physical and electrical connections of the test groups 10 and 20 are possible.

In the above descriptions, the bypass circuits 12/22, 15/25, and 18/28 may be flip flops.

Figure 2:
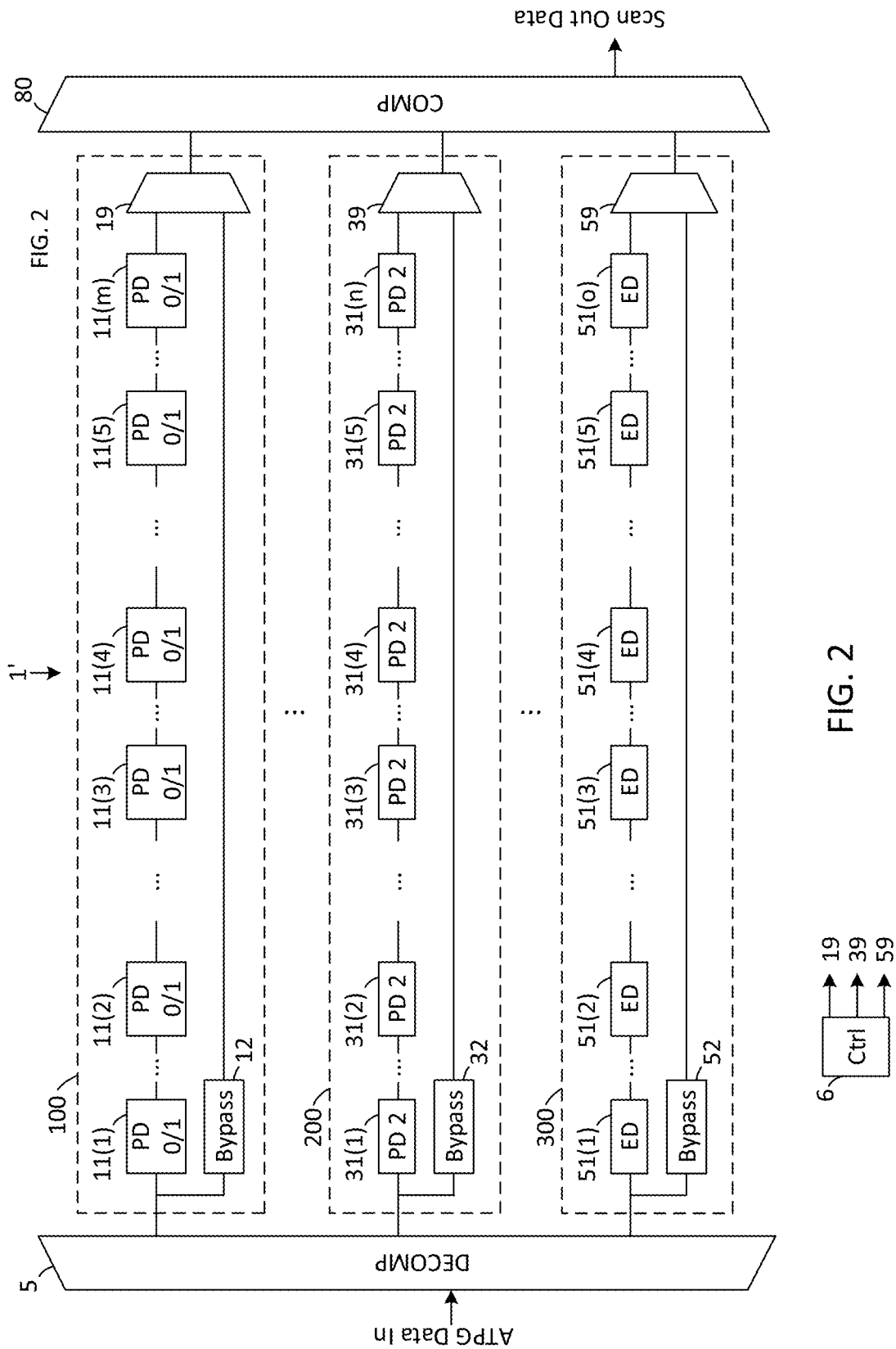
FIG. 2 is a schematic block diagram showing a second embodiment of circuitry enabling the independently selectable testing of different power domains within a single integrated circuit chip using a same scan chain compressor-decompressor circuit, as described herein.

Another configuration for the test circuit 1' is shown in FIG. 2. The test circuit 1' includes a first test group 100 receiving the currently utilized voltage stack from a scan decompression circuit 5. Power flow is from the scan decompression circuit 5 to the first test group 100, and through the first test group 100 to a scan compression circuit 80.

The first test group 100 includes: a first series of areas 11(1), . . . , 11($m$) coupled in series within a first power domain PD0 and a second power domain PD1 coupled between the scan decompression circuit 5 and a first input of a multiplexer 19, and a PD0/1 bypass 12 coupled between the scan decompression circuit 5 and a second input of the multiplexer 19. The output of the multiplexer 19 is coupled to the scan compression circuit 19.

The test circuit 1' includes a second test group 200 receiving the currently utilized voltage stack from the scan decompression circuit 5. Data flow is from the scan decompression circuit 5 to the second test group 200, and through the second test group 200 to the scan compression circuit 80.

The second test group 200 includes: a first series of areas 31(1), . . . , 31($n$) coupled in series within the third power domain PD2 coupled between the scan decompression circuit 5 and a first input of the multiplexer 39, and a PD2 bypass 32 coupled between the scan decompression circuit 5 and a second input of the multiplexer 39.

The test circuit 1' includes a third test group 300 receiving the currently utilized voltage stack from the scan decompression circuit 5. Data flow is from the scan decompression circuit 5 to the third test group 300, and through the third test group 300 to the scan compression circuit 80.

The third test group 300 includes: a first series of areas 51(1), . . . , 51($o$) coupled in series within the independent power domain ED coupled between the scan decompression circuit 5 and a first input of the multiplexer 59, and an ED bypass 52 coupled between the scan decompression circuit 5 and a second input of the multiplexer 59. It is to be appreciated that the ED bypass 52 and multiplexer 59 are placed within the PD2 power domain so as to remain functional when the independent power domain ED is not selected.

There may be multiple instances of the first test group 100, second test group 200, and third test group 300, as will be appreciated by those of skill in the art.

As stated above, power domains PD1 and PD0 are to be tested at 0.8 v, while power domain PD2 is to be tested at 0.88 v. The independent power domain ED is likewise to be tested at 0.88 v.

Utilizing the structure of the first group 100, the power domains PD1 and PD0 can be tested at 0.8 v without the power domain PD2 and the independent power domain ED also being tested at 0.8 v at the same time. To accomplish this, a control circuit 6 suitably operates the multiplexers 19, 39, and 59.

For example, to test the power domains PD1 and PD0 at 0.8 v, without testing the power domain PD2 and the independent power domain ED, the control circuit 6 causes the multiplexer 19 to select the output of the areas 11($m$), causes the multiplexer 39 to select the PD2 bypass 32, and causes the multiplexer 59 to select the ED bypass 52. Thus, the scan chain is from the scan decompression circuit 5, through the areas 11, and through the multiplexer 19 to the scan compression circuit 80.

To test the power domain PD2 at 0.88 v, the control circuit 6 causes the multiplexer 19 to select the PD0/1 bypass 12, causes the multiplexer 39 to select the output of the areas 31($n$), and causes the multiplexer 59 to select the ED bypass 52. Thus, the scan chain is from the scan decompression circuit 5, through the areas 31, through the multiplexer 39 to the scan compression circuit 80.

To test the independent power domain ED, the control circuit 6 causes the multiplexer 19 to select the PD0/1 bypass 12, causes the multiplexer 39 to select the PD2 bypass 32, and causes the multiplexer 59 to select the output of the areas 51($o$). Thus, the scan chain is from the scan decompression circuit 5, through the areas 51, through the multiplexer 59 to the scan compression circuit 80.

In the above descriptions, the bypass circuits 12, 32, and 52 may be flip flops.

B. Testing Multiple Power Domains Using Different CODECs

Figure 3:
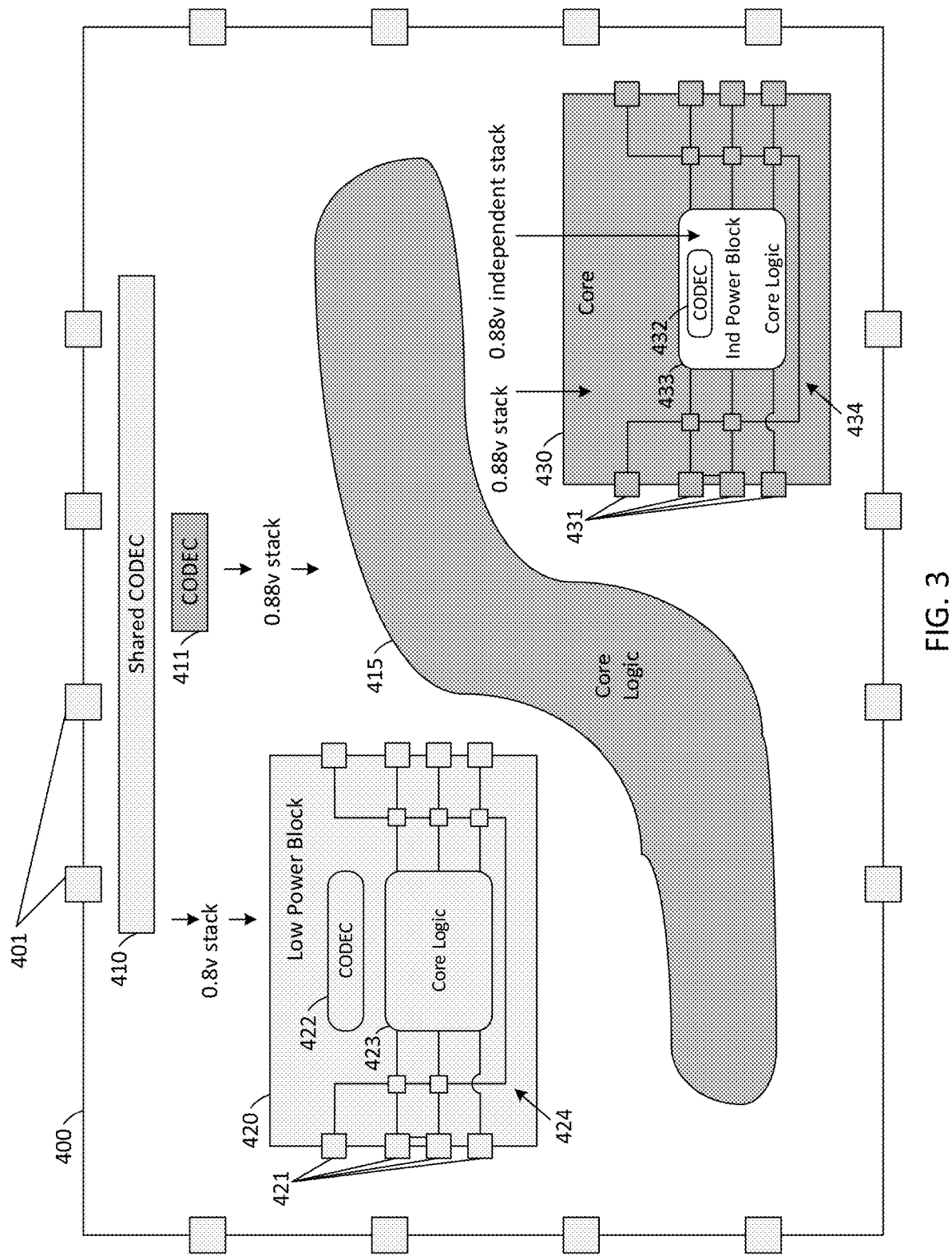
FIG. 3 is a block diagram showing a first embodiment of an integrated circuit chip enabling the independently selectable testing of different power domains using multiple different scan chain compressor-decompressor circuits, as described herein.

Now shown in FIG. 3 is an integrated circuit chip 400 having multiple scan compressor-scan decompressor circuits ("CODECs"). The integrated circuit chip 400 has a first region 420 that is within the first power domain PD0 and second power domain PD1, with areas within core logic 423 in the first region 420 being formed into a scan chain during testing and connected between the elements of the CODEC 422. Notice here that the CODEC 422 is located outside of the core logic 423, and that a boundary chain 424 (formed from the existing functional flops within the first region 420) surrounds the core logic 423 and therefore PD1 and PD0 share the same boundary chain 424. This first region 420 can be considered to be a low powered block, powered by a voltage stack with a minimum voltage of 0.8 v, with the CODEC 422 serving the scan chain within the first region 420 being located within the first region 420 itself.

The integrated circuit chip 400 has a second region 415 that is within the second power domain PD2, the second region including areas within being formed into a scan chain during testing and connected between elements of the CODEC 411. For this section region, there is no boundary chain surrounding the core logic 415. The second region 415 can be considered to be a top level block, with the CODEC 411 serving scan chain within the second region 415 being located outside of the second region 415, and illustrated at being toward the top (with respect to the page) of the integrate circuit chip 400.

The integrated circuit chip 400 has a third region 430 that is within the independent domain ED, with areas within core logic 433 in the third region 430 being formed into a scan chain during testing and connected between the elements of the CODEC 432. Notice here that the CODEC 432 is located inside of the core logic 433 and that the core logic 433 is within the independent power block (0.88 v independent power stack ED), while the remainder of the third region 430 is within the second power domain PD2. A boundary chain 434 (formed from dedicated flops within the third region 430, and thus these flops are not reused and existing functional flops) is located within the third region itself 430 and surrounds the core logic 433. with the codec 432 serving the scan chain within the third region 430 being within the third region 430.

As illustrated the boundary chain 434 wraps the core logic 433 of the third region 430 within the third region 430, but may instead wrap the core logic 433 from outside of the third region.

Notice that there is a top level CODEC 410 within the integrated circuit chip 400.

As stated above, power domains PD1 and PD0 are to be tested at 0.8 v, while power domain PD2 is to be tested at 0.88 v. The independent power domain ED is likewise to be tested at 0.88 v.

To test the first region 420, and therefore the first power domain PD0 and the second power domain PD1, 0.8 v is applied to integrated circuit chip 400 and the first region 420 is tested through the top level CODEC 410 and CODEC 422 of the first region 420. The clock signal for the second region 415 and third region 430 will be gated (so that the respective CODECs 411 and 432 are not active at this time), and therefore scan in and scan out will occur for the first region 420, while the scan chains second region 415 and third region 430 remain static. The test for the first region 420 may be an internal test, in which the boundary chain 424 sends test signals through the core logic 423, captures the result, and then passes the output outside of the first region 420.

To test the second region 415, 0.88 v is applied to integrated circuit chip 400 and the second region 415 is tested through the top level CODEC 410 and the CODEC 411. The clock signal for the first region 420 and the third region 430 will be gated (so that the respective CODECs 422 and 432 are not active at this time), and therefore the scan chains of the first region 420 and third region 430 remain static. However, the boundary chains 424 and 434 will be controlled by the CODEC 411 and used for performing external testing on the core logic of the second region 415.

To test the third region 430, 0.88 v is applied to integrated circuit chip 400 and the third region 430 tested through the top level CODEC 410 and the CODEC 432 within the core logic 433, and scan in and scan out will occur for the third region 430, and the test may be an internal test, in which the boundary chain 434 sends test signals through the core logic 433, captures the result, and then passes the output outside of the third region 430. During this, the clock signal for the first region 420 and the second region 415 will be gated (so that the respective CODECs 422 and 411 are not active at this time), and therefore the scan chains of the first region 420 and third region 415 remain static.

In some instances, the third region 430 may not be powered, in which case its scan chains also remain static.

Figure 4:
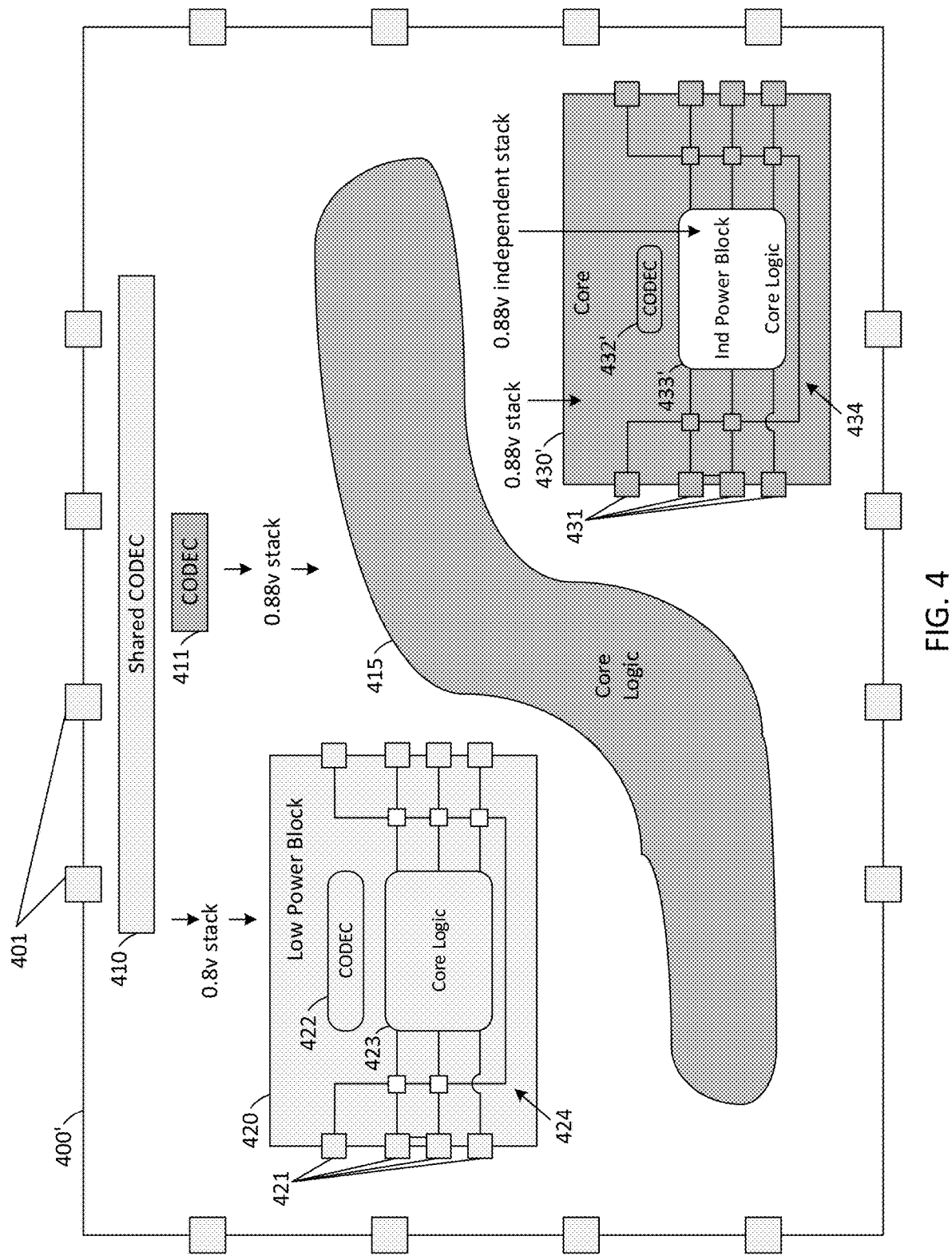
FIG. 4 is a block diagram showing a second embodiment of an integrated circuit chip enabling the independently selectable testing of different power domains using multiple different scan chain compressor-decompressor circuits, as described herein.

A variation of the integrated circuit chip 400' is shown in FIG. 4, where the CODEC 432' is within the third region 430' but outside of the core logic 433'. This eliminates the need for signal isolation of signals input to the CODEC 432', because the CODEC 432' does not receive the independent power stack.

The configurations shown herein speed up testing because areas within power domains not requiring testing with a given voltage stack are not tested at that time. Consider for example, the bypassing performed within the first and second test groups 10 and 20 in FIG. 1, and how it can result in multiple areas being skipped, and therefore increased testing speed.

Also, since areas not designed for lower minimum voltages are no longer tested with those minimum voltages, this means that testing can be performed at the maximum speed for each given minimum voltage used during testing, and that a lower frequency need not be used to ensure that power domains not being tested do not malfunction.

Finally, it is clear that modifications and variations may be made to what has been described and illustrated herein, without thereby departing from the scope of this disclosure, as defined in the annexed claims.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An integrated circuit chip, comprising:
a single scan chain compressor-decompressor pair comprising a scan chain compressor and a scan chain decompressor, the scan chain compressor providing output to at least one scan out pin, the scan chain decompressor receiving input from at least one automatic test pattern generation (ATPG) pin;
a test grouping comprising:
a first multiplexer located within first and second power domains;
a plurality of first components located within the first and second power domains, the plurality of first components being selectively formed into a first scan chain portion coupled between the scan chain decompressor and a first input of the first multiplexer;
a first bypass circuit located within the first and second power domains, the first bypass circuit being coupled between the scan chain decompressor and a second input of the first multiplexer;
a second multiplexer located within a third power domain;
a plurality of second components located within the third power domain, the plurality of second components being selectively formed into a second scan chain portion coupled between an output of the first multiplexer and a first input of the second multiplexer;
a second bypass circuit located within the third power domain, the second bypass circuit being coupled between the output of the first multiplexer and a second input of the second multiplexer;
a third multiplexer;
a plurality of third components located within a fourth power domain, the plurality of third components being selectively formed into a scan chain portion coupled between an output of the second multiplexer and a first input of the third multiplexer; and a third bypass circuit coupled between the output of the second multiplexer and a second input of the third multiplexer, an output of the third multiplexer being coupled to the scan chain compressor;

a control circuit configured to control the first, second, and third multiplexers such that a scan chain can selectively be placed into a configuration:
   a) extending from the scan chain decompressor, through the plurality of first components into the first multiplexer, from the first multiplexer through the second bypass circuit into the second multiplexer, from the second multiplexer through the third bypass circuit into the third multiplexer, and from the third multiplexer into the scan chain compressor;
   b) extending from the scan chain decompressor, through the first bypass circuit into the first multiplexer, from the first multiplexer through the plurality of second components into the second multiplexer, from the second multiplexer through the third bypass circuit into the third multiplexer, and from the third multiplexer into the scan chain compressor; and
   c) extending from the scan chain decompressor, through the first bypass circuit into the first multiplexer, from the first multiplexer through the second bypass circuit into the second multiplexer, from the second multiplexer through the plurality of third components into the third multiplexer, and from the third multiplexer into the scan chain compressor.

2. The integrated circuit chip of claim 1, wherein the third bypass circuit and third multiplexer are located within the third power domain.

3. The integrated circuit chip of claim 1, wherein the fourth power domain is an independent power domain that is supplied independently of the first, second, and third power domains.

4. The integrated circuit chip of claim 1, wherein a minimum voltage supplied to the first and second power domains is a first voltage; and wherein a minimum voltage supplied to the third and fourth power domains is a second voltage greater than the first voltage.

5. The integrated circuit chip of claim 4, wherein the control circuit is configured to control the first, second, and third multiplexers to place the scan chain into configuration a) to thereby test the first and second power domains at the first voltage, while bypassing testing of the third and fourth power domains.

6. The integrated circuit chip of claim 4, wherein the control circuit is configured to control the first, second, and third multiplexers to place the scan chain into configuration b) to thereby test the third power domain at the second voltage, while bypassing testing of the first, second, and fourth power domains.

7. The integrated circuit chip of claim 4, wherein the control circuit is configured to control the first, second, and third multiplexers to place the scan chain into configuration c) to thereby test the fourth power domain at the second voltage, while bypassing testing of the first, second, and third power domains.

8. An integrated circuit chip, comprising:
   a single scan chain compressor-decompressor pair comprising a scan chain compressor and a scan chain decompressor, the scan chain compressor providing output to at least one scan out pin, the scan chain decompressor receiving input from at least one automatic test pattern generation (ATPG) pin;
   a first test grouping comprising:
      a first multiplexer located within a first power domain;
      a plurality of first components located within the first power domain, the plurality of first components being selectively formed into a first scan chain portion coupled between the scan chain decompressor and a first input of the first multiplexer; and
      a first bypass circuit located within the first power domain, the first bypass circuit being coupled between the scan chain decompressor and a second input of the first multiplexer;
   a second test grouping comprising:
      a second multiplexer;
      a plurality of second components located within a second power domain, the plurality of second components being selectively formed into a second scan chain portion coupled between an output of the first multiplexer and a first input of the second multiplexer; and
      a second bypass circuit located within the second power domain, the second bypass circuit being coupled between the output of the first multiplexer and a second input of the second multiplexer;
      wherein an output of the second multiplexer is ultimately coupled to the scan chain compressor; and
   a control circuit configured to control the first and second multiplexers to selectively form a scan chain in a configuration which:
      a) extends from the scan chain decompressor, through the plurality of first components into the first multiplexer, from the first multiplexer through the second bypass circuit into the second multiplexer, and ultimately into the scan chain compressor; and
      b) extends from the scan chain decompressor, through the first bypass circuit into the first multiplexer, from the first multiplexer through the plurality of second components into the second multiplexer, and ultimately into the scan chain compressor.

9. The integrated circuit chip of claim 8, wherein a minimum voltage supplied to the first power domain is a first voltage; and wherein a minimum voltage supplied to the second power domain is a second voltage greater than the first voltage.

10. The integrated circuit chip of claim 9, wherein the control circuit is configured to control the first and second multiplexers to place the scan chain into configuration a) to thereby test the first power domain at the first voltage, while bypassing testing of the second power domain.

11. The integrated circuit chip of claim 9, wherein the control circuit is configured to control the first and second multiplexers to place the scan chain into configuration b) to thereby test the second power domain at the second voltage, while bypassing testing of the first power domain.

12. The integrated circuit chip of claim 9, wherein the second multiplexer is located within the first power domain.

13. The integrated circuit chip of claim 12, wherein the second power domain is an independent power domain that is supplied independently of the first power domain.

14. The integrated circuit chip of claim 8, wherein the second multiplexer is located within the first power domain.

15. An integrated circuit chip, comprising:
   a single scan chain compressor-decompressor pair comprising a scan chain compressor and a scan chain decompressor, the scan chain compressor providing output to at least one scan out pin, the scan chain decompressor receiving input from at least one automatic test pattern generation (ATPG) pin;
   a first test grouping comprising:
      a first multiplexer located within a first power domain;

a plurality of first components located within the first power domain, the plurality of first components being selectively formed into a scan chain portion coupled between the scan chain decompressor and a first input of the first multiplexer, an output of the first multiplexer being coupled to the scan chain compressor; and a first bypass circuit located within the first power domain, the first bypass circuit being coupled between the scan chain decompressor and a second input of the first multiplexer;

a second test grouping comprising:

a second multiplexer;

a plurality of second components located within a second power domain, the plurality of second components being selectively formed into a scan chain portion coupled between the scan chain decompressor and a first input of the second multiplexer, an output of the second multiplexer being coupled to the scan chain compressor; and a second bypass circuit located within the second power domain, the second bypass circuit being coupled between the scan chain decompressor and a second input of the second multiplexer;

a control circuit configured to control the first and second multiplexers such that the scan chain can selectively be placed into a configuration:

a) extending from the scan chain decompressor, through the plurality of first components into the first multiplexer, and from the first multiplexer into the scan chain compressor; and b) extending from the scan chain decompressor, through the plurality of second components into the second multiplexer, and from the second multiplexer into the scan chain compressor;

wherein a minimum voltage supplied to the first power domain is a first voltage; and wherein a minimum voltage supplied to the second power domain is a second voltage greater than the first voltage.

16. The integrated circuit chip of claim 15, wherein the control circuit is configured to control the first and second multiplexers to place the scan chain into configuration a) to thereby test the first power domain at the first voltage, while bypassing testing of the second power domain.

17. The integrated circuit chip of claim 15, wherein the control circuit is configured to control the first and second multiplexers to place the scan chain into configuration b) to thereby test the second power domain at the second voltage, while bypassing testing of the first power domain.

* * * * *